US006970628B2

(12) United States Patent
Boudreau

(10) Patent No.: US 6,970,628 B2
(45) Date of Patent: Nov. 29, 2005

(54) ACTIVE OPTICAL ALIGNMENT AND ATTACHMENT THERETO OF A SEMICONDUCTOR OPTICAL COMPONENT WITH AN OPTICAL ELEMENT FORMED ON A PLANAR LIGHTWAVE CIRCUIT

(75) Inventor: Robert A. Boudreau, Corning, NY (US)

(73) Assignee: Inplane Photonics, Inc., South Plainfield, NJ (US)

( * ) Notice: Subject to any disclaimer, the term of this patent is extended or adjusted under 35 U.S.C. 154(b) by 0 days.

(21) Appl. No.: 10/826,145

(22) Filed: Apr. 15, 2004

(65) Prior Publication Data

US 2005/0232545 A1   Oct. 20, 2005

(51) Int. Cl.[7] ............................. G02B 6/26; G02B 6/36
(52) U.S. Cl. ......................................... 385/52; 385/90
(58) Field of Search .............................. 385/52, 88–94

(56) References Cited

U.S. PATENT DOCUMENTS

| | | | |
|---|---|---|---|
| 6,227,724 B1 * | 5/2001 | Verdiell ........................ 385/91 |
| 6,487,355 B1 | 11/2002 | Flanders ...................... 385/134 |
| 6,554,496 B1 | 4/2003 | Flanders ....................... 385/94 |
| 6,559,464 B1 | 5/2003 | Flanders et al. ............ 250/548 |
| 6,625,372 B1 | 9/2003 | Flanders et al. ............. 385/134 |
| 6,674,585 B1 | 1/2004 | Calvet et al. ................ 359/822 |
| 6,886,993 B2 * | 5/2005 | Verdiell et al. ................ 385/88 |
| 2002/0048446 A1 | 4/2002 | Masghati et al. ............ 385/137 |
| 2003/0162003 A1 | 8/2003 | Atia et al. .................... 428/209 |
| 2004/0114884 A1 * | 6/2004 | Shinde et al. .................. 385/94 |

OTHER PUBLICATIONS

Peter S. Whitney, "Hybrid Integration of Photonic Subsystems", *2002 Electronic Components and Technology Conference*, pp. 578-582.

* cited by examiner

*Primary Examiner*—John D. Lee
*Assistant Examiner*—Tina M. Wong
(74) *Attorney, Agent, or Firm*—Mayer Fortkort & Williams PC; Stuart H. Mayer, Esq.

(57) ABSTRACT

A method and apparatus is provided for attaching a bulk element processing an optical beam to a PLC and optically aligning the bulk element with an optical element formed on the PLC. The method begins by securing the bulk element to a first side of a substrate. A first side of a flexure element is secured to the first side of the substrate. A second side of the flexure element is secured to a first side of the PLC on which the optical element is formed such that the bulk element and the optical element are in optical alignment to within a first level of tolerance. Subsequent to the step of securing the second side of the flexure element, a force is exerted on at least a second side of the substrate to thereby flex the flexure element. The force causes sufficient flexure of the flexure element to optically align the bulk element and optical element to within a second level of tolerance that is more stringent than the first level of tolerance.

56 Claims, 2 Drawing Sheets

Side View of a laser attachment to a planar lightwave circuit.

Side View of a laser attachment to a planar lightwave circuit.

Hermetic capsule for a laser on a PLC.

ACTIVE OPTICAL ALIGNMENT AND ATTACHMENT THERETO OF A SEMICONDUCTOR OPTICAL COMPONENT WITH AN OPTICAL ELEMENT FORMED ON A PLANAR LIGHTWAVE CIRCUIT

FIELD OF THE INVENTION

The invention relates generally to fiber optics, and in particular to an arrangement for providing optical alignment between a semiconductor device, such as a laser or detector, and an optical waveguide such as a planar lightwave circuit or an optical fiber.

BACKGROUND OF THE INVENTION

In fiber optic technology there are many instances where it is necessary to optically align and optically couple a bulk element such as a semiconductor device and/or a micro electromechanical system (MEMs) to an optical component located on a planar lightwave circuit (PLC). A PLC employs planar optical integration to manufacture waveguide circuits on silicon wafers, using processing techniques similar to those used in the silicon microelectronics industry. Doped-silica waveguides are usually preferred because they have a number of attractive properties including low cost, low loss, stability, and compatibility for coupling to laser diodes, other waveguides, high NA fiber and standard fiber. Such a waveguide is fabricated on a carrier substrate, which typically comprises silicon or silica. The cost of achieving proper alignment between the bulk element and the PLC is often high because it involves the use of expensive lenses and processes in order to prevent light from being lost as its passes between the components being aligned. The coupling efficiency of the light, which is highly dependent on accurate alignment, should generally be maximized since this helps offset the many ways light can be lost in a PLC. Moreover, when the optical system being aligned is designed to transmit single mode light, high efficiency coupling can be particularly hard to achieve because the tolerance to misalignment is so great.

Some of the most common bulk elements used in fiber optics are active semiconductor devices such as lasers, light emitting diodes, and semiconductor optical amplifiers. Passive bulk elements that are employed include such semiconductor devices as detectors and filters as well as other optical elements such as fiber. For these devices to be useful, there must an alignment mechanism to optically couple them with the PLC.

The mechanical tolerance for adequate optical alignment in such systems is severe since these devices are small and are affected by the modal properties of the light. The most difficult systems to align involve semiconductor laser-based devices. A semiconductor laser that is to be optically aligned to a single-mode waveguide, which is the type commonly used in optical telecommunication systems, has a typical positional misalignment tolerance of less than about one micron, and typically on the order of about a half a micron.

Typically, a semiconductor laser is aligned to an optical fiber or PLC by either a soldering or welding technique. If an active alignment technique is used, an optical signal is transmitted through the components and detected. The alignment is performed by manipulating the optical fiber or PLC so that the transmission characteristics result in the highest possible performance level for the system, which usually is achieved when the coupling efficiency is maximized.

The process of active alignment can be costly and time consuming because the alignment tolerance is so tight that in the course of bonding the optical components can shift or move, thereby causing alignment impairments. For example, when welding is employed distortion often arises that causes a shift in position, necessitating realignment of the components by bending them back into position after the bond is formed. Similarly, when soldering is employed, the solder usually shrinks upon cooling, causing some shift in the position of the components.

In a conventional alignment process in which a semiconductor device such as a laser is to be attached and optically aligned with an optical component such as an optical fiber, the semiconductor device is first bonded to a substrate. A weldable fixture is also attached to substrate. The optical fiber is secured to the weldable fixture. After securing the fiber to the fixture, the fixture is physically manipulated to achieve the desired coupling efficiency. The semiconductor device is not moved during the alignment process because it is electrically connected and thermally contacted for heat sinking to maintain stability. As a result the laser cannot be moved on the bonded substrate. This technique requires specialized fixtures and flexures to enable bending in order to move the optical fiber back into position. The fixtures may consist of special fiber mounts that allow the fiber to be optically coupled to components such as a laser or a PLC. The flexures are complex structures enabling bending in various directions, and are sometimes manufactured by a LIGA process, which is a relatively expensive electroplating process that uses a thick photoresist specially patterned by exposure to synchrotron radiation.

Typical state-of-the-art device alignment techniques require industrial lasers to provide laser welding or laser soldering. These industrial lasers are expensive, and require special designs within the product, including extra piece parts, in order to implement the bonding and alignment processes. Apart from the added cost of the additional parts and processing equipment, these extra piece parts can substantially increase the size of the overall assembly.

SUMMARY OF THE INVENTION

In accordance with the present invention, a method and apparatus is provided for attaching a bulk element processing an optical beam to a PLC and optically aligning the bulk element with an optical element formed on the PLC. The method begins by securing the bulk element to a first side of a substrate. A first side of a flexure element is secured to the first side of the substrate. A second side of the flexure element is secured to a first side of the PLC on which the optical element is formed such that the bulk element and the optical element are in optical alignment to within a first level of tolerance. Subsequent to the step of securing the second side of the flexure element, a force is exerted on at least a second side of the substrate to thereby flex the flexure element. The force causes sufficient flexure of the flexure element to optically align the bulk element and optical element to within a second level of tolerance that is more stringent than the first level of tolerance.

In accordance with one aspect of the invention, an optical coupling efficiency of an optical beam propagating between the bulk element and optical element is monitored.

In accordance with another aspect of the invention, the step of exerting a force is performed such that the coupling efficiency is maximized.

In accordance with another aspect of the invention, the optical element is a planar waveguide formed on the PLC.

In accordance with another aspect of the invention, the bulk element is a semiconductor laser.

In accordance with another aspect of the invention, the substrate is formed from aluminum nitride.

In accordance with another aspect of the invention, the bulk element is selected from the group consisting of a semiconductor laser, a semiconductor optical amplifier, a light emitting diode, a beam splitter, a thin film, a filter, a mirror, a birefringent material, a polarizer, and a diffractive element.

In accordance with another aspect of the invention, the flexure element is formed from gold or a gold alloy.

In accordance with another aspect of the invention, the flexure element is formed from lead.

In accordance with another aspect of the invention, the flexure element is formed from nickel or a nickel alloy.

In accordance with another aspect of the invention, the flexure element is formed from Kovar™.

In accordance with another aspect of the invention, the flexure element is formed from a thermally conductive material sufficient to serve as a heat sink for the bulk element.

In accordance with another aspect of the invention, the second side of the substrate on which the force is exerted is a back surface of the substrate opposing the first side of the substrate.

In accordance with another aspect of the invention, the second side of the substrate on which the force is exerted is an edge of the substrate.

In accordance with another aspect of the invention, the step of securing an extension element to an edge of the PLC such that the extension element is located directly below the bulk element.

In accordance with another aspect of the invention, the extension element has an etched pocket allowing clearance for the bulk element.

In accordance with another aspect of the invention, the step of enclosing the substrate with a cover that mates with the first side of the PLC. In accordance with another aspect of the invention, the substrate has an etched pocket allowing clearance for the bulk element.

In accordance with another aspect of the invention, the substrate is enclosed with a cover that mates with both the first side of the PLC and the extension element.

In accordance with another aspect of the invention, the cover forms a hermetic seal with the first side of the PLC.

In accordance with another aspect of the invention, the cover is formed from Kovar™.

In accordance with another aspect of the invention, the cover is formed from silicon.

In accordance with another aspect of the invention, the cover is formed from Pyrex™.

In accordance with another aspect of the invention, the hermetic seal is established by a solder seal ring.

In accordance with another aspect of the invention, a retaining disk is secured between the first side of the flexure element and the first side of the substrate.

In accordance with another aspect of the invention, the retaining disk has a diameter greater than a diameter of the flexure element.

In accordance with another aspect of the invention, the flexure element and the retaining disk are formed from a common material.

DETAILED DESCRIPTION OF INVENTION

The present invention attaches and aligns a bulk element such as a semiconductor laser to an optical component formed on a PLC. While the bulk element will be described below for illustrative purposes only as a semiconductor laser, the bulk element alternatively may comprise a variety of different active and/or passive elements that process an optical beam. For example, active devices include semiconductor lasers and amplifiers, light emitting diodes, as well as other devices offering higher levels of functionality. Passive devices include beam splitters, thin films, filters, mirrors, birefringent material, polarizers, and diffractive elements, for example.

As detailed below, the bulk element is first attached to its own substrate in a conventional manner and the resulting subassembly is bonded to the PLC via a bendable or flexure element of low yield strength that allows for active optical alignment. Active alignment is then achieved by moving the bulk element into its proper position. In contrast, the aforementioned conventional attachment and alignment process moves the PLC optical component into position. Among its other advantages, the invention eliminates the need for laser soldering or laser welding equipment. It also eliminates the need for hardware or fixtures to hold the optical waveguides in place. Further, by eliminating these items it is not necessary to allow space to accommodate them, thereby reducing the size of the overall assembly. The invention allows attachment of the bulk element using conventional diebonding equipment and allows preassembly of the bulk element with its substrate by conventional prequalified means. The flexure element can be flexed to provide for active alignment of the bulk element to the PLC optical component after the bonding processes are completed, eliminating alignment losses caused by bonding. The flexure element may be, for example, a small gold shim made by hole punching a metal sheet and thus does not require any expensive machining or LIGA processing.

Figure 1:
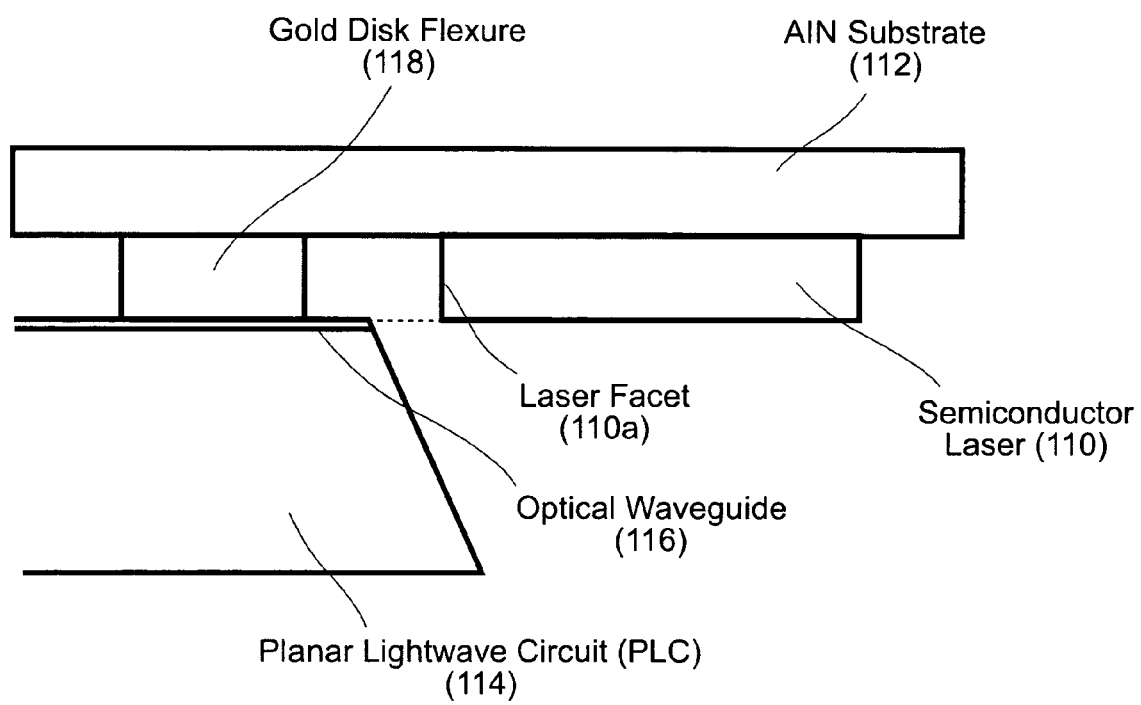
FIG. 1 shows an optical apparatus constructed in accordance with the present invention in which a bulk element is attached to and optically aligned with an optical component formed on a PLC.

FIG. 1 shows one embodiment of the invention in which the bulk element is a semiconductor laser 110 that is to be optically aligned with a waveguide 116 located on a planar lightwave circuit (PLC) 114. Instead of attaching the laser 110 directly to the PLC 114, the laser is first attached to its own substrate 112, which in the case of a semiconductor laser is often aluminum nitride (AlN). Aluminum nitride is commonly used as a substrate for semiconductor lasers because AlN has excellent thermal conductivity and is expansion matched to the GaAs material from which such lasers are formed, reducing stress which could otherwise alter the lasing wavelength of the device.

A flexure element 118 is also attached to the substrate 112. As detailed below, the flexure element 118 enables the laser 110 to be optically aligned to the waveguide 116 on PLC 114 after the laser 110 has been bonded to the substrate 112. This is an important feature of the invention because the bonding process would otherwise cause misalignment and because during active alignment the bonded laser can be operated at room temperature since the bonding process that normally uses heat is not needed during the alignment step. The laser 110 and waveguide 116 can be optically aligned in an active alignment process by applying force to the laser substrate 112 to thereby bend the flexure element 118 by an appropriate amount.

The flexure element 118 is preferably made of a material that has a low yield strength, meaning that it will bend but not tend to spring back. The flexure element 118 must also be stable and remain in position as long as nothing physically contacts it. A preferred material for the flexure element 118 is gold or a gold alloy, which have low yield strength characteristics. Other exemplary materials with a low yield strength that may be employed are lead, nickel, nickel alloys, copper, silver and Kovar™. One advantage of gold is that it is compatible with a gold tin eutectic solder and can be diebonded to bond it in position using performs of AuSn (80/20) eutectic solder, a solder commonly used to bond laser chips to AlN substrates.

The inventive attachment and optical alignment process begins by diebonding and wirebonding the laser 110 to the AlN substrate 112 in a conventional manner, after which the resulting laser subassembly is aged and tested, also in a conventional manner. The only distinction between the formation of the laser subassembly in the present invention and in a conventional laser subassembly process is that in the present invention the AlN substrate 112 will generally be larger in size so that it includes a surface portion in front of the laser's emitting facet on which the flexure element 118 can be mounted. Commercially available AlN substrates for supporting semiconductor lasers generally do not have this extra surface area.

After the laser 110 is bonded, burned in and tested on the AlN substrate 112 in the aforementioned manner, the flexure element 118 is bonded to the AlN substrate 112 at a location in front of the laser facet 110a. The flexure element 118 may be bonded by the same technique used to bond laser 110 to the AlN substrate 112. That is, the same equipment can be used to bond both the laser 110 and the flexure element 118. For example, an AuSn (80/20) eutectic solder may be used to establish both bonds.

In addition to its low yield strength, the flexure element 118 should have a sufficiently high thermal conductivity to serve as a heat sink for the heat generated by laser 110. This alleviates the need to attach any additional heat sinks or cooling elements such as a thermo-electric cooler (TEC) to the AlN substrate 112, which could adversely impact optical alignment by flexing the substrate 112. Of course, the thermal capacity of the flexure element 118 can be increased as needed by increasing its size along the dimensions that contact the AlN substrate 112 and the PLC 114. For example, if the flexure element 118 is configured in the shape of a disk, its diameter can be increased to increase its thermal capacity. The thickness of the flexure element 118, however, is preferably about the same as the thickness of the laser 110 to facilitate initial alignment. Of course, the present invention encompasses flexure elements 118 of any shape and size and is not intended as a limitation on the invention.

The resulting laser, flexure element and substrate subassembly is next diebonded to the PLC 114 also using, for example, a AuSn (80/20) solder. This step may be conveniently performed by inverting the subassembly so that the top of the laser 110 (usually the p side) and the top of the flexure element 118 are facing the PLC 114. The top of the flexure element 118 is bonded to the PLC 114 so that the laser 110 extends in front of the facet of the waveguide 116 in rough optical alignment, as shown in FIG. 1.

While not shown in FIG. 1, a wirebond is made from the back of the AlN substrate 112 to a point on the PLC 114 to complete the electrical circuit. The wirebond serves as one electrical connection for the laser 110. The other electrical connection to the laser 110 is established through the flexure element 118 itself. The bottom contacts for the laser 110 and the flexure element 118 are located on the same metal pad. The two resulting connections allow the laser 110 to be powered.

Once the bonding process is complete, optical alignment between the laser 110 and waveguide 116 may be performed in an active manner. That is, the laser 110 is powered and aligned to the waveguide 116 by exerting a downward force on the back of the AlN substrate 112 until the optical signal coupled into the waveguide 116 is maximized. Since a conventional diebonder is generally able to initially place the laser 110 to within about 10 microns of its target position, the flexure element 118 only needs to bend sufficiently so that the laser 110 can be adjusted over these remaining 10 microns. It should be noted that because the aperture of waveguide 116 is significantly larger than the output aperture of the laser 110, the coupling efficiency is not very sensitive on the angular misalignment between the axis of the laser 110 and the axis of the waveguide 116, at least up to an angular misalignment of about 3 degrees in a typical application. In such an application the angular misalignment provided by exerting a force on the flexure element 118 will typically be less than about 0.1 degrees to achieve maximum coupling efficiency.

Among the directions along which alignment must be achieved, the most sensitive are lateral alignments, such as up and down (i.e., in a direction perpendicular to the axis of waveguide 116 that also traverses the substrate 112) and side to side (i.e., in a direction perpendicular to the axis of waveguide 116 that is also parallel to the planes encompassing the substrate 116 and the PLC 114). Up and down alignment is achieved by exerting a downward force on the AlN substrate, either in front of or behind the flexure element 118. Exerting a force in front of the flexure element 118 causes the laser 110 to move down while exerting the force behind the flexure element 118 causes the laser to move upward. Side to side movements are accomplished by exerting a force on a side or edge of the AlN substrate 112. Since the linear displacements should be very small, the angular misalignment will be negligible.

The present invention achieves multiple advantages with respect to the conventional bonding and optical alignment techniques. First, the invention enables the use of commercially available semiconductor lasers or other bulk elements that are already mounted, burned in, and pretested without the need for modifications. The laser or other bulk element is simply provided as a chip located on its own submount. Thus, the present invention advantageously makes use of a low cost, prequalified component. Moreover, the critical manufacturing process of the laser or other bulk element is completely separated from the alignment process. This is a key advantage, because doing otherwise might require a custom semiconductor device that would be highly specialized and thus much more expensive. A second key advantage is that the invention allows alignment to take place after the bonding steps are performed. In this way the process yield arising from alignment can be dealt with separately from the process yield arising from attachment. Since the alignment process is independent of the attachment process it does not affect the optimization of the attachment process. A third key advantage is that the alignment can be reworked, meaning that if for some reason proper alignment is not achieved, the optical components can always be repositioned by bending the flexure element until the alignment is satisfactory. A fourth key advantage is that the overall size of the assembly is relatively small, and in some cases may not be much larger than the size of the semiconductor laser itself. A fifth key advantage is that because the semiconductor laser rather than the waveguide is moved to achieve alignment, the invention allows many additional devices to be mounted and independently aligned on a single PLC substrate.

Figure 2:
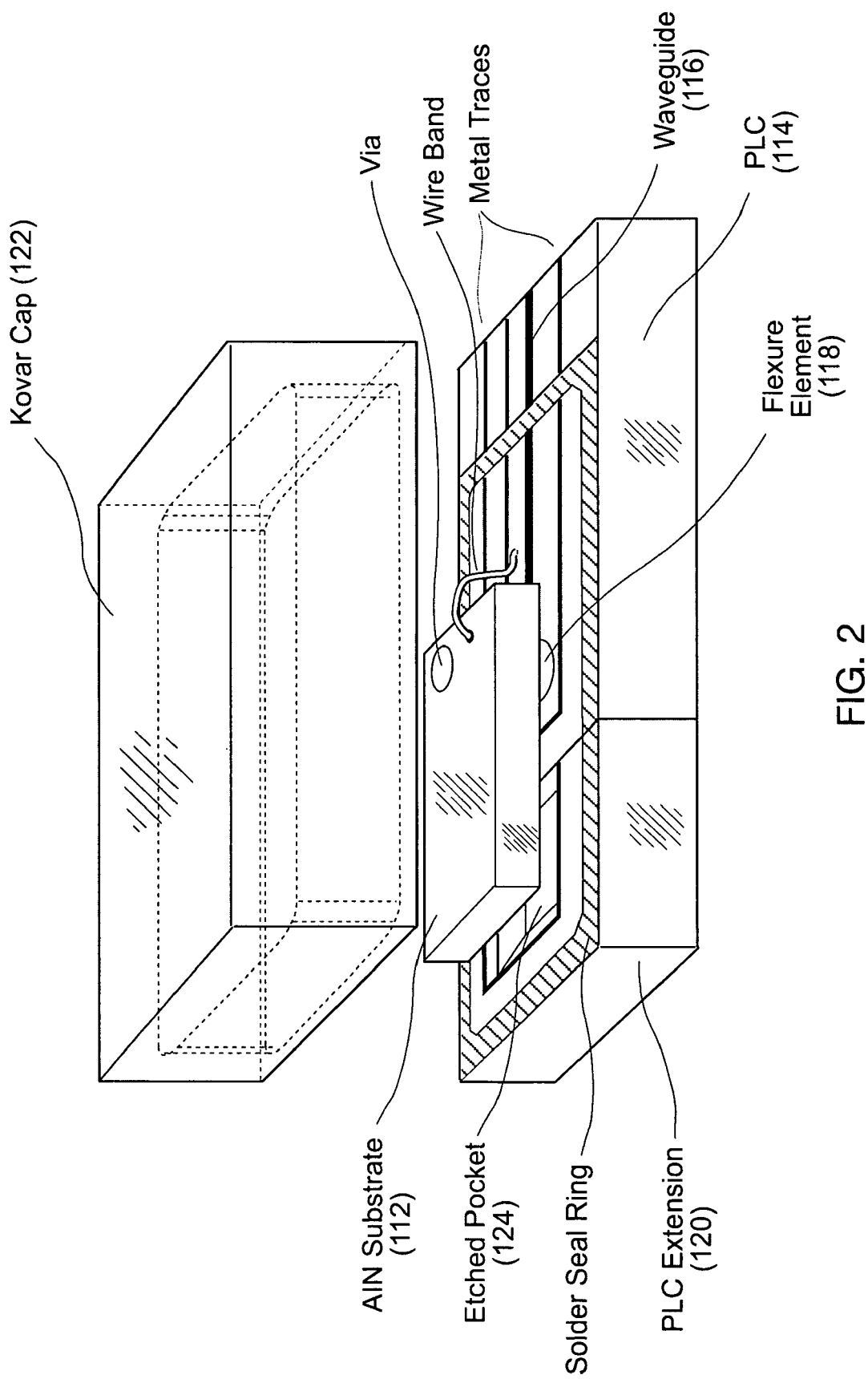
FIG. 2 shows an embodiment of the optical apparatus constructed in accordance with the present invention in which an hermetic seal is provided over the bulk element.

The assembly shown in FIG. 1 may be finalized in the manner shown in FIG. 2 to provide a very compact, hermetically sealed component. As shown, a PLC extension 120 is soldered to the end of the PLC 114 and serves as a continuation of the PLC 114 that extends directly below the AlN substrate 112. A cover 122 formed from an inexpensive material such as etched kovar, for example, may be placed over the AlN substrate to form a sealed capsule with the PLC 114 and PLC extension 120. In general, the cover 122 may be formed from any material that is expansion matched to PLC 114. Accordingly, suitable materials include silicon and Pyrex™, for example.

To assemble the structure shown in FIG. 2 the end faces of the PLC 114 and PLC extension 120 that are to be mated are polished, coated and soldered together to make a complete substrate, and then the cap is soldered in place. The PLC extension 120 may advantageously include an etched pocket 124 to allow clearance for the laser and its wirebond.

In one alternative embodiment of the invention, the flexure element 118 may be mounted to a retaining disk (not shown), that is in turn mounted directly to the surface of the PLC 114. The mounting disk, which should have a diameter that is greater than the diameter of the flexure element 118, may advantageously reduce the stress that would otherwise arise at the corners of the flexure element 118 where they contact the PLC 114. In some embodiments of the invention the mounting disk may be formed from the same material as the flexure element.

In another alternative embodiment of the invention only a single PLC substrate is used instead of the two substrate segments 114 and 120 that are employed in FIG. 2. While this may simplify assembly, it requires the presence of a high quality etch on the end face of the waveguide 116 prior to assembly.

The present invention has been modeled both thermally and mechanically for a high power semiconductor laser having lateral dimensions of 350×750 microns. The flexure element 118 that was employed was formed from gold and had a diameter of 375 microns. The amount of force that needs to be exerted to achieve plastic deformation was at least about 50 to 100 gms. A number of results from this analysis are worth noting. First, there was only about an 11 degree temperature rise for a 300 mW thermal load laser and this temperature rise was found to be independent of ambient temperature within the temperature range modeled. If flexure elements having larger diameters are used the temperature rise should be even further reduced. Of course, it is important to avoid placing any high thermal impedance materials in the heat path, so the flexure element should be bonded directly between the AlN and the Si substrate of the PLC with no layer of glass therebetween. Second, the thermal expansion coefficient of the resulting design is such that when used in an environment of −84 to +84 C the shift in the alignment is negligible, on the order of 0.2 microns, due to the small size of the individual component parts. Finally, several shock and vibration situations were modeled and it was shown that the assembly was immune against shock within 300 g's of force, which is quite a large amount of force, and that the mode of vibration of the assembly is at an acceptably high frequency, greater than 60 KHz, due to its stiffness and small size. Finally, it was found that in many cases a flexure element formed from hard gold is preferable to one formed from soft annealed gold. Hard gold is more resistant to exceeding its yield strength when stressed, and thus will not lead to a permanent change in the alignment.

What is claimed is:

1. A method of attaching a bulk element processing an optical beam to a PLC and optically aligning the bulk element with an optical element formed on the PLC, said method comprising the steps of:
   a. securing the bulk element to a first side of a substrate;
   b. securing a first side of a flexure element to the first side of the substrate;
   c. securing a second side of the flexure element to a first side of PLC on which the optical element is formed such that the bulk element and the optical element are in optical alignment to within a first level of tolerance; and
   d. subsequent to step (c), exerting a force on at least a second side of the substrate to thereby flex the flexure element, said force causing sufficient flexure of the flexure element to optically align the bulk element and optical element to within a second level of tolerance that is more stringent than the first level of tolerance.

2. The method of claim 1 further comprising the step of monitoring an optical coupling efficiency of an optical beam propagating between the bulk element and optical element.

3. The method of claim 1 wherein the step of exerting a force is performed such that the coupling efficiency is maximized.

4. The method of claim 1 wherein the optical element is a planar waveguide formed on the PLC.

5. The method of claim 1 wherein the bulk element is a semiconductor laser.

6. The method of claim 5 wherein the substrate is formed from aluminum nitride.

7. The method of claim 1 wherein the bulk element is selected from the group consisting of a semiconductor laser, a semiconductor optical amplifier, a light emitting diode, a beam splitter, a thin film, a filter, a mirror, a birefringent material, a polarizer, and a diffractive element.

8. The method of claim 1 wherein the flexure element is formed from gold or a gold alloy.

9. The method of claim 1 wherein the flexure element is formed from lead.

10. The method of claim 1 wherein the flexure element is formed from nickel or a nickel alloy.

11. The method of claim 1 wherein the flexure element is formed from Kovar™.

12. The method of claim 1 wherein the flexure element is formed from a thermally conductive material sufficient to serve as a heat sink for the bulk element.

13. The method of claim 1 wherein the second side of the substrate on which the force is exerted is a back surface of the substrate opposing the first side of the substrate.

14. The method of claim 1 wherein the second side of the substrate on which the force is exerted is an edge of the substrate.

15. The method of claim 1 further comprising the step of securing an extension element to an edge of the PLC such that the extension element is located directly below the bulk element.

16. The method of claim 15 wherein said extension element has an etched pocket allowing clearance for the bulk element.

17. The method of claim 1 further comprising the step of enclosing the substrate with a cover that mates with the first side of the PLC.

18. The method of claim 17 wherein said substrate has an etched pocket allowing clearance for the bulk element.

19. The method of claim 15 further comprising the step of enclosing the substrate with a cover that mates with both the first side of the PLC and the extension element.

20. The method of claim 17 wherein the cover forms a hermetic seal with the first side of the PLC.

21. The method of claim 20 wherein the cover is formed from Kovar™.

22. The method of claim 20 wherein the cover is formed from silicon.

23. The method of claim 20 wherein the cover is formed from Pyrex™.

24. The method of claim 20 wherein the hermetic seal is established by a solder seal ring.

25. The method of claim 1 further comprising the step of securing a retaining disk between the first side of the flexure element and the first side of the substrate.

26. The method of claim 25 wherein said retaining disk has a diameter greater than a diameter of the flexure element.

27. The method of claim 25 wherein said flexure element and said retaining disk are formed from a common material.

28. An optical apparatus constructed in accordance with the method of claim 1.

29. A method of attaching a bulk element processing an optical beam to a first substrate and optically aligning the bulk element with an optical element located on the first substrate, said method comprising the steps of:
  a. securing the bulk element to a first side of a second substrate;
  b. securing a first side of a flexure element to the first side of the second substrate;
  c. securing a second side of the flexure element to a first side of first substrate on which the optical element is formed such that the bulk element and the optical element are in optical alignment to within a first level of tolerance; and
  d. subsequent to step (c), exerting a force on at least a second side of the second substrate to thereby flex the flexure element, said force causing sufficient flexure of the flexure element to optically align the bulk element and optical element to within a second level of tolerance that is more stringent than the first level of tolerance.

30. The method of claim 29 further comprising the step of monitoring an optical coupling efficiency of an optical beam propagating between the bulk element and optical element.

31. The method of claim 29 wherein the step of exerting a force is performed such that the coupling efficiency is maximized.

32. The method of claim 29 wherein the optical element is a planar waveguide formed on the first substrate.

33. The method of claim 29 wherein the bulk element is a semiconductor laser.

34. The method of claim 33 wherein the second substrate is formed from aluminum nitride.

35. The method of claim 29 wherein the bulk element is selected from the group consisting of a semiconductor laser, a semiconductor optical amplifier, a light emitting diode, a beam splitter, a thin film, a filter, a mirror, a birefringent material, a polarizer, and a diffractive element.

36. The method of claim 29 wherein the flexure element is formed from gold or a gold alloy.

37. The method of claim 29 wherein the flexure element is formed from lead.

38. The method of claim 29 wherein the flexure element is formed from nickel or a nickel alloy.

39. The method of claim 29 wherein the flexure element is formed from Kovar™.

40. The method of claim 29 wherein the flexure element is formed from a thermally conductive material sufficient to serve as a heat sink for the bulk element.

41. The method of claim 29 wherein the second side of the second substrate on which the force is exerted is a back surface of the second substrate opposing the first side of the substrate.

42. The method of claim 29 wherein the second side of the second substrate on which the force is exerted is an edge of the second substrate.

43. The method of claim 29 further comprising the step of securing an extension element to an edge of the first substrate such that the extension element is located directly below the bulk element.

44. The method of claim 43 wherein said extension element has an etched pocket allowing clearance for the bulk element.

45. The method of claim 29 further comprising the step of enclosing the second substrate with a cover that mates with the first side of the first substrate.

46. The method of claim 45 wherein said first substrate has an etched pocket allowing clearance for the bulk element.

47. The method of claim 43 further comprising the step of enclosing the second substrate with a cover that mates with both the first side of the first substrate and the extension element.

48. The method of claim 45 wherein the cover forms a hermetic seal with the first side of the first substrate.

49. The method of claim 48 wherein the cover is formed from Kovar™.

50. The method of claim 48 wherein the cover is formed from silicon.

51. The method of claim 48 wherein the cover is formed from Pyrex™.

52. The method of claim 48 wherein the hermetic seal is established by a solder seal ring.

53. The method of claim 29 further comprising the step of securing a retaining disk between the first side of the flexure element and the first side of the substrate.

54. The method of claim 53 wherein said retaining disk has a diameter greater than a diameter of the flexure element.

55. The method of claim 53 wherein said flexure element and said retaining disk are formed from a common material.

56. An optical apparatus constructed in accordance with the method of claim 29.

* * * * *